(12) United States Patent
Leobandung

(10) Patent No.: US 11,313,810 B2
(45) Date of Patent: Apr. 26, 2022

(54) SECURE SEMICONDUCTOR WAFER INSPECTION UTILIZING FILM THICKNESS

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 16/683,655

(22) Filed: Nov. 14, 2019

(65) Prior Publication Data
US 2021/0148834 A1    May 20, 2021

(51) Int. Cl.
| G01N 21/95 | (2006.01) |
| H01L 21/66 | (2006.01) |
| H01L 21/67 | (2006.01) |
| G01B 11/06 | (2006.01) |
| G01N 21/956 | (2006.01) |
| G06T 7/00 | (2017.01) |

(52) U.S. Cl.
CPC ......... *G01N 21/9501* (2013.01); *G01B 11/06* (2013.01); *G01N 21/956* (2013.01); *G06T 7/001* (2013.01); *H01L 21/67288* (2013.01); *H01L 22/20* (2013.01); *G06T 2207/30148* (2013.01)

(58) Field of Classification Search
CPC ............... H01L 22/12; H01L 21/67288; H01L 21/67253; G01N 21/956; G01N 21/9505; G01N 21/08; G01N 15/02; G01B 11/06; G01B 7/066

USPC ..... 356/625, 630–632, 237.1–237.5; 438/14; 250/559.27, 559.2
See application file for complete search history.

(56) References Cited

U.S. PATENT DOCUMENTS

| 8,678,442 B2 | 3/2014 | Bergsmann et al. |
| 9,042,164 B2 | 5/2015 | Katti et al. |
| 9,547,745 B1 | 1/2017 | Juang et al. |
| 10,056,304 B2 | 8/2018 | Bishop et al. |

(Continued)

FOREIGN PATENT DOCUMENTS

| KR | 20060074578 A | 7/2006 |
| KR | 20070013893 A | 1/2007 |

(Continued)

*Primary Examiner* — Hoa Q Pham
(74) *Attorney, Agent, or Firm* — Fleit Intellectual Property Law; Thomas S. Grzesik

(57) ABSTRACT

A method for verifying semiconductor wafers includes receiving a semiconductor wafer including a plurality of layers. A first set of measurement data is obtained for at least one layer of the plurality of layers, where the first set of measurement data includes at least one previously recorded thickness measurement for one or more portions of the at least one layer. The first set of measurement data is compared to a second set of measurement data for the at least one layer. The second set of measurement data includes at least one new thickness measurement for the one or more portions of the at least one layer. The semiconductor wafer is determined to be an authentic wafer based on the second set of measurement data corresponding to the first set of measurement data, otherwise the semiconductor is determined to not be an authentic wafer.

20 Claims, 9 Drawing Sheets

(56) References Cited

U.S. PATENT DOCUMENTS

| | | | | |
|---|---|---|---|---|
| 2002/0142493 | A1* | 10/2002 | Halliyal | G01B 11/0683 |
| | | | | 438/14 |
| 2008/0144922 | A1* | 6/2008 | Naiki | G03F 9/7092 |
| | | | | 382/145 |
| 2012/0129431 | A1* | 5/2012 | Hui | B24B 49/02 |
| | | | | 451/5 |
| 2013/0155421 | A1* | 6/2013 | Langstaff | G07D 7/164 |
| | | | | 356/630 |
| 2013/0319612 | A1* | 12/2013 | Su | H01J 37/3244 |
| | | | | 156/345.24 |

FOREIGN PATENT DOCUMENTS

| | | |
|---|---|---|
| TW | I295133 B | 3/2008 |
| WO | 2017096244 | 6/2017 |

* cited by examiner

SECURE SEMICONDUCTOR WAFER INSPECTION UTILIZING FILM THICKNESS

BACKGROUND OF THE INVENTION

The present disclosure generally relates to the field of semiconductors, and more particularly relates to secure inspection of semiconductor devices for trusted manufacturing thereof.

Semiconductor chip security has become increasingly important in recent years. One mechanism for securing semiconductor chips is through the use of trusted foundries. A trusted foundry adheres to a set of protocols to ensure the integrity, authenticity, and confidentiality of semiconductor chips during manufacturing. However, trusted foundries may not be available to all chip customers or may not have the capabilities to fabricate a desired semiconductor chip. Therefore, in many instances chip customers utilize untrusted foundries for manufacturing of their semiconductor chips.

The use of untrusted foundries for semiconductor chip manufacturing presents various security concerns since the chip customer may not be able to control or monitor the manufacturing process at an untrusted foundry. For example, an untrusted foundry may be able to counterfeit the semiconductor chip, reverse engineer the layout of the semiconductor chips, or steal sensitive or secret data required for fabrication of the semiconductor chip. In addition, there is no guarantee that the fabricated semiconductor chips do not contain malicious or damaging features that have been added by the untrusted foundry. Unfortunately, viable solutions to the above problems currently do not exist.

SUMMARY OF THE INVENTION

In one embodiment, a method for verifying semiconductor wafers comprises receiving a semiconductor wafer comprising a plurality of layers. A first set of measurement data is obtained for at least one layer of the plurality of layers. The first set of measurement data comprises at least one previously recorded thickness measurement for one or more portions of the at least one layer. The first set of measurement data is compared to a second set of measurement data for the at least one layer. The second set of measurement data comprises at least one new thickness measurement for the one or more portions of the at least one layer. The semiconductor wafer is determined to be an authentic wafer based on the second set of measurement data corresponding to the first set of measurement data. The semiconductor wafer is determined to not be an authentic wafer based on the second set of measurement data failing to correspond to the first set of measurement data.

In another embodiment, a system for verifying semiconductor wafers comprises at least one information processing system comprising memory and one or more processors. The system further comprises a wafer layer measurement system communicatively coupled to the at least one information processing system. The at least one information processing system and the layer measurement system operate to perform a process. The process comprises receiving a semiconductor wafer comprising a plurality of layers. A first set of measurement data is obtained for at least one layer of the plurality of layers. The first set of measurement data comprises at least one previously recorded thickness measurement for one or more portions of the at least one layer. The first set of measurement data is compared to a second set of measurement data for the at least one layer. The second set of measurement data comprises at least one new thickness measurement for the one or more portions of the at least one layer. The semiconductor wafer is determined to be an authentic wafer based on the second set of measurement data corresponding to the first set of measurement data. The semiconductor wafer is determined to not be an authentic wafer based on the second set of measurement data failing to correspond to the first set of measurement data.

In a further embodiment, a computer program product for verifying semiconductor wafers comprises a computer readable storage medium having program instructions embodied therewith. The program instructions executable by an information processing system to perform a method. The method comprises receiving a semiconductor wafer comprising a plurality of layers. A first set of measurement data is obtained for at least one layer of the plurality of layers. The first set of measurement data comprises at least one previously recorded thickness measurement for one or more portions of the at least one layer. The first set of measurement data is compared to a second set of measurement data for the at least one layer. The second set of measurement data comprises at least one new thickness measurement for the one or more portions of the at least one layer. The semiconductor wafer is determined to be an authentic wafer based on the second set of measurement data corresponding to the first set of measurement data. The semiconductor wafer is determined to not be an authentic wafer based on the second set of measurement data failing to correspond to the first set of measurement data.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
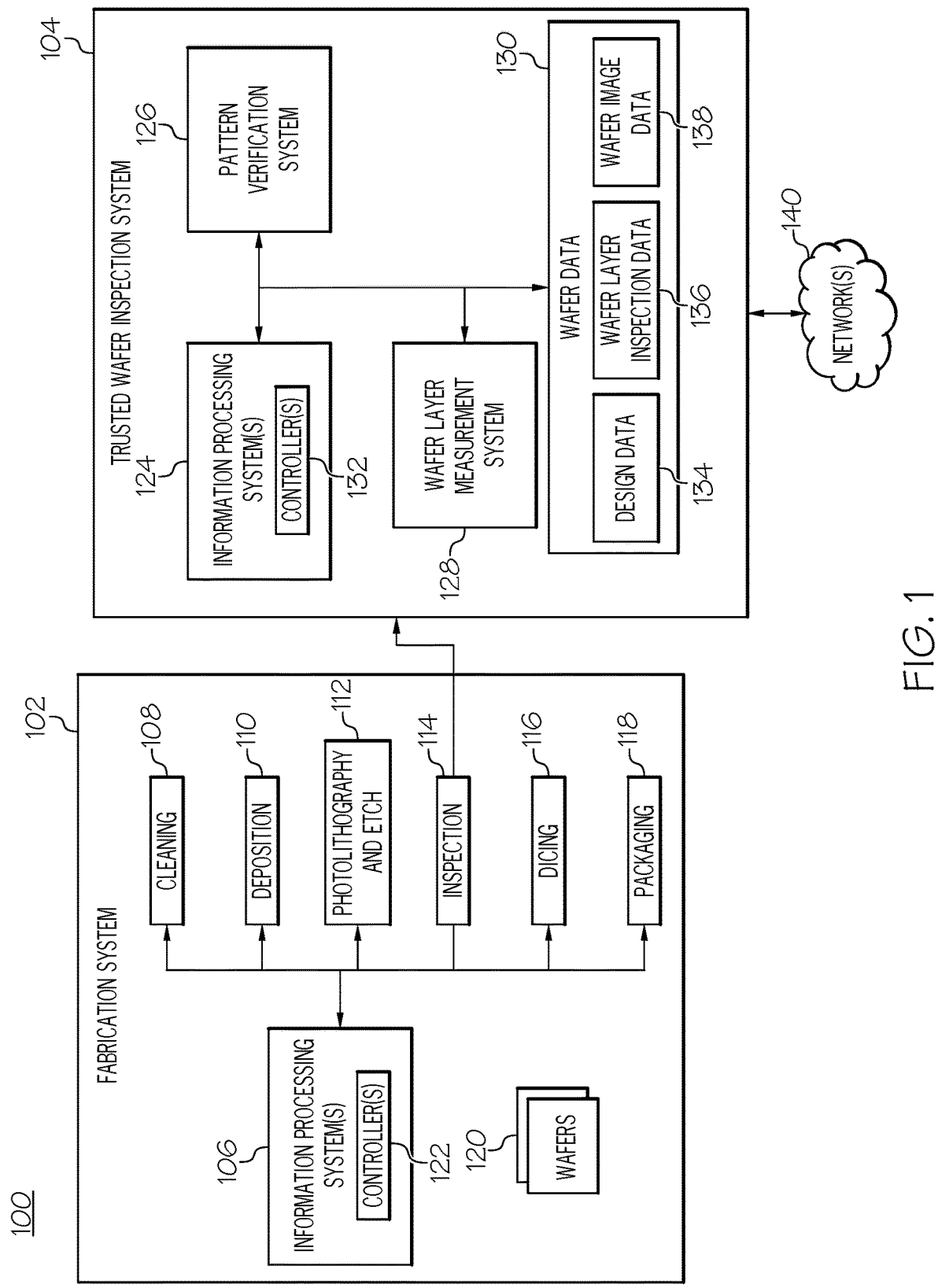
FIG. 1 is a block diagram illustrating a system for securing and verifying semiconductor wafers according one embodiment of the present invention.

As required, detailed embodiments are discussed herein. However, it is to be understood that the provided embodiments are merely examples and that the systems and methods described below can be embodied in various forms. Therefore, specific structural and functional details discussed herein are not to be interpreted as limiting, but merely as a basis for the claims and as a representative basis for teaching one skilled in the art to variously employ the present subject matter in virtually any appropriately detailed structure and function. Further, the terms and phrases used herein are not intended to be limiting, but rather, to provide an understandable description of the concepts.

As will be discussed in greater detail below, embodiments of the present invention overcome security issues associated with untrusted semiconductor foundries by utilizing a trusted wafer inspection process. According to at least one embodiment, after each layer of patterned features is formed on a semiconductor wafer a trusted pattern verification system is utilized to verify that the formed pattern matches the intended pattern as defined by a corresponding design for the layer. If the formed pattern and the intended pattern do not match the verification system determines that the semiconductor wafer has been compromised. If the formed pattern and the intended pattern do match the verification system determines that the wafer is secure (i.e., has not been compromised) at this point in the fabrication process.

However, once a subsequent layer of patterned features has been formed it is difficult (if not impossible) to re-verify previously formed layers of patterns since removing layers would damage the semiconductor wafer. This presents the opportunity for a semiconductor wafer, which has been verified by the trusted pattern verification system, to be modified or replaced with an unauthorized another wafer comprising damaging or malicious features. For example, after a given layer of patterns has been verified by the trusted verification system the authorized semiconductor wafer is returned to the fabrication line of the untrusted foundry. At this point, damaging or malicious features may be added to the previously verified wafer (or to an unauthorized semiconductor wafer) and a subsequent layer of patterned features corresponding to the trusted mask may be formed thereon. In other words, the malicious features are hidden under a layer of patterned features that match the intended/ expected features defined by the trusted mask. Therefore, when the unauthorized semiconductor wafer is transferred to the trusted verification system the verification process may not determine that the current wafer is an unauthorized or malicious wafer since the current layer of patterned features corresponds to the expected layer of patterned features.

Embodiments of the present invention overcome this problem by further utilizing a trusted wafer layer measurement system that generates one or more secure fingerprints/ identifiers for the semiconductor wafer based on layer thickness. According to at least one embodiment, after a given layer of patterned features has been verified the trusted wafer layer measurement system measures the thickness of one or more features of the current layer. The measurement may be taken at one or more locations on the layer and multiple measurements may for the layer at the one or more locations but within different areas across the wafer. Data such as the measured thicknesses, the type of features that were measured, the locations at which the measurements were taken, the identifier of the layer for which the measurements were taken, and/or the like may be recorded. The recorded measurements act as a fingerprint for the semiconductor wafer since the film/layer thickness profile is unique for each wafer depending on the deposition process utilized to form the film/layer.

After one or more subsequent layers of patterned features have been formed and verified, the wafer layer measurement system re-measures the thickness of any previously measured feature layers at their previously measured locations. In another embodiment a similar re-measurement process may be performed after fabrication of the semiconductor wafer has completed. If the current measured thickness of the layer(s) matches with the previous measured thickness the system determines that the wafer is a secure/authentic wafer that has not been replaced or modified.

Referring now to the drawings in which like numerals represent the same of similar elements, FIG. 1 illustrates a block diagram of an operating environment 100 for the trusted inspection and verification of semiconductor wafers during manufacturing thereof. In various embodiments, the operating environment 100 comprises a semiconductor fabrication plant 102 (e.g., a foundry) and a trusted wafer inspection system (TWIS) 104. The semiconductor fabrication plant 102 is responsible for the manufacturing and packaging of semiconductor devices. In one embodiment, the semiconductor fabrication plant 102 comprises one or more information processing systems 106; fabrication and packaging stations/components 108 to 118; and semiconductor wafers 120.

The information processing system 106 controls the one or more fabrication/packaging stations and their components. In one embodiment, the information processing system 106 may comprise at least one controller 122 that may be part of one or more processors or may be a component that is separate and distinct from the processor(s) of the information processing system 106. The one or more fabrication and packaging stations 108 to 118 may include a cleaning station 108, a deposition station 110, a photolithography station 112, an inspection station 114, a dicing station 116, a packaging station 118, and/or the like.

In some embodiments, two or more of fabrication/packaging stations are separate from each other where the semiconductor wafer 120 is moved from one station to a different station after processing. However, in other embodiments, two or more of these stations may be combined into a single station. In addition, one or more of the stations/components 108 to 118 may not be a physical station per se but may refer to a fabrication or packaging process(es) performed by components of the fabrication plant 102. In some embodiments, one or more of the stations/processes 108 to 118 may be removed from the plant 102 and/or additional stations/processes may be added. Also, embodiments of the present invention are not limited to a semiconductor fabrication plant configured as shown in FIG. 1 and are applicable to any semiconductor fabrication plant.

The TWIS 104, in one embodiment, comprises one or more information processing systems 124, a pattern verification system 126, a wafer layer measurement system 128 and wafer data 130. It should be noted that the TWIS 104 is not limited to these components as one or more components may be removed and/or additional components may be added to the TWIS 104. In one embodiment, the information processing system 124 may comprise at least one controller 132 that may be part of one or more processors or may be a component that is separate and distinct from the processor(s) of the information processing system 124. The wafer data 130, in one embodiment, comprises design data 134, wafer layer inspection data 136, and wafer image data 138. In some embodiment, the TWIS 104 is communicatively coupled to one or more networks 140 such as a local area network (LAN), a general wide area network (WAN), and/or a public network (e.g., the Internet).

It should be noted that the information processing system 124 may be separate from or part of the pattern verification system 126 and wafer layer measurement system 128. In addition, the various operations discussed below with respect to the information processing system 124 may be similarly performed by separate information processing systems disposed within each of the pattern verification system 126 and wafer layer measurement system 128. In addition, the various operations discussed below with respect to these systems 126, 128 may be similarly performed by the information processing system 124. In addition, the pattern verification system 126 and wafer layer measurement system 128 are not required to be separate from each other and may be implemented as a single system.

Embodiments of the present invention utilize the TWIS 104 to perform trusted inspection/verification of the wafers 120. In one or more of these embodiment, the TWIS 104 is a trusted system that is secured by physical and/or software-based mechanisms that prevent unauthorized access to and tampering with the TWIS 104. The TWIS 104 may be located within (or nearby) the semiconductor fabrication plant 102 in a manner that prevents unauthorized access to the TWIS 104. For example, the TWIS 104 may be located within a room or nearby building that only authorized individuals have access to. These individuals may be authorized to access the TWIS 104 by the owner/operator of the TWIS 104, the customer for which the semiconductor wafers 120 are being fabricated, a trusted entity managing the semiconductor wafers 120, and/or the like.

In another embodiment, the TWIS 104 is part of the fabrication/packaging line where only authorized individuals may make changes to the TWIS 104. Even further one or more components of the TWIS 104 may be disposed outside of the semiconductor fabrication plant 102. For example, in one embodiment, the wafer layer measurement system 128, wafer inspection data 136, image data 138, and/or other components are situated at a foundry customer's location. However, in other embodiments, these components are located at the semiconductor fabrication plant 102 as well. The TWIS 104 and its components are discussed in greater detail below.

Figure 2:
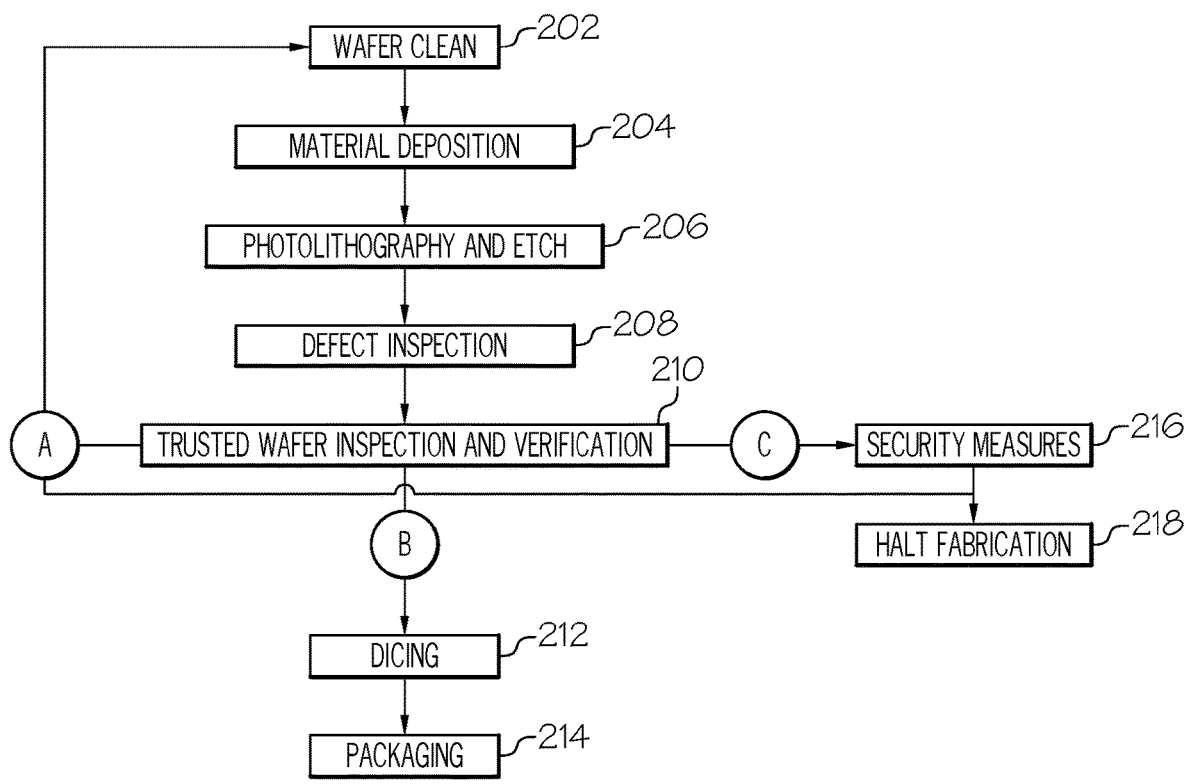
FIG. 2 is an operational flow diagram illustrating an overall process of securing and verifying semiconductor wafers according one embodiment of the present invention.

FIG. 2 is an operational flow diagram illustrating an overall process of fabricating a semiconductor device including trusted inspection of the semiconductor wafer 120. The process shown in FIG. 2 begins after the wafer 120 has been inspected for any defects. After the wafer 120 has been inspected, the wafer 120 is processed by the cleaning station 108 at step 202. The cleaning station 108 removes any contaminants from the surface of the wafer 120 using, for example, a wet chemical treatment. Then, the wafer 120 is processed by the deposition station 110 at step 204. The deposition station 110 deposits, grows, and/or transfers one or more layers of various materials are onto the wafer using processes such as chemical vapor deposition (CVD), physical vapor deposition (PVD), atomic layer deposition (ALD), and/or the like.

After the desired materials have been deposited the wafer 120 is processed by the photolithography and etching station 112 at step 206. For example, the wafer 120 may be cleaned and prepared by removing any unwanted moisture from the surface of the wafer 120. An adhesion promoter may also be applied to the surface of the wafer 120. A layer of photoresist material is then formed on the surface of wafer 120 (or the adhesion promoter layer if formed). A process such as, but not limited to, spin coating may be used to form the photoresist layer. Excess photoresist solvent may be removed by pre-baking the coated semiconductor wafer 120. The photoresist coated wafer 120 is then exposed to one or more patterns of light. The patterns may be formed by projecting the light through a photomask (also referred to herein as "mask") created for the current layer. The mask is formed based on trusted design data 134 and may be produced by the semiconductor fabrication plant 102, a photomask fabrication plant, and/or the like. The design data 160, in one embodiment, comprises all shapes/patterns that are intended to be printed on the wafer 120 for a given layer. In some embodiments, the patterns may be formed using a maskless process.

The bright parts of the image pattern cause chemical reactions, which result in one of the following situations depending on the type of resist material being used. Exposed positive-tone resist material becomes more soluble so that it may be dissolved in a developer liquid, and the dark portions of the image remain insoluble. Exposed negative-tone resist material becomes less soluble so that it may not be dissolved in a developer liquid, and the dark portions of the image remain soluble.

A post exposure bake (PEB) process may be performed that subjects the wafer 120 to heat for a given period of time after the exposure process. The PEB performs and completes the exposure reaction. The PEB process may also reduce mechanical stress formed during the exposure process. The wafer 120 is then subjected to one or more develop solutions after the post exposure bake. The develop solution(s) dissolves away the exposed portions of the photoresist. After development, the remaining photoresist forms a stenciled pattern across the wafer surface, which accurately matches the desired design pattern. An etching process is then performed that subjects the wafer 120 to wet or dry chemical agents to remove one or more layers of the wafer 120 not protected by the photoresist pattern. Any remaining photoresist material may then be removed after the etching process using, for example, chemical stripping, ashing, etc. It should be noted that semiconductor fabrication is not limited to the above described process and other fabrication processes are applicable as well.

The photolithographic process results in a layer of patterned features (also referred to herein as a "layer of patterns", "layer of features", "pattern of features", "patterns", and/or "pattern"). After the current layer of features has been patterned the wafer 120 is processed by one or more defect inspection stations 114 at step 208. In one embodiment, the defect inspection station 114 inspects the current layer of patterned features for defects and corrects/manages any defects using one or more methods known to those of ordinary skill in the art. Once the defect inspection process has been performed the wafer 120 is passed to the TWIS 104 for trusted wafer inspection and verification at step 210. As will be discussed in greater detail below, trusted wafer inspection and verification may include pattern verification processes and wafer layer thickness inspection and verification. It should be noted that, in some embodiments, instead of having a separate defect inspection station 114 the TWIS 104 performs defect inspection in addition to trusted wafer inspection and verification. In these embodiments, the wafer is passed to the TWIS 104 after the current layer of features has been patterned at step 206.

If the TWIS 104 is satisfied with the results of the inspection and verification operations for the wafer 120, the wafer 120 is passed back to the cleaning station 108 as indicated by path "A" if additional fabrication processing is needed. The above described processes are then repeated until all of the desired layers of patterned features have been formed and fabrication of the wafer 120 has been completed. However, if fabrication of the wafer 120 has been completed the process follows path "B" where the wafer 120 is processed by the dicing station 116 to separate the dies from the wafer 120 at step 212. The packaging station 118 then packages and tests the dies using one or more packaging and testing methods at step 214. If, at step 210, the TWIS 104 is not satisfied with the results of the inspection and verification operations due to, for example, unauthorized changes the process follows path "C" where one or more security measures are taken at step 216. Fabrication may optionally be stopped at step 218 or another action taken as will be discussed in greater detail below.

It should be noted that, in at least some embodiments, one or more of the trusted wafer inspection and verification operations of step 210 are not performed for every layer of the manufacturing process. For example, these operations may not be performed for sacrificial, temporary, or other layers that do not become part of the integrated circuit. Also, in at least one embodiment, layers found to be an unreliable source of inspection/verification data such as C4 layers are not inspected and/or verified. Instead, more reliable layers such as front-end-of-line (FEOL) and back-end-of-line (BEOL) layers are selected for inspection and/or verification operations at step 210.

Figure 3:
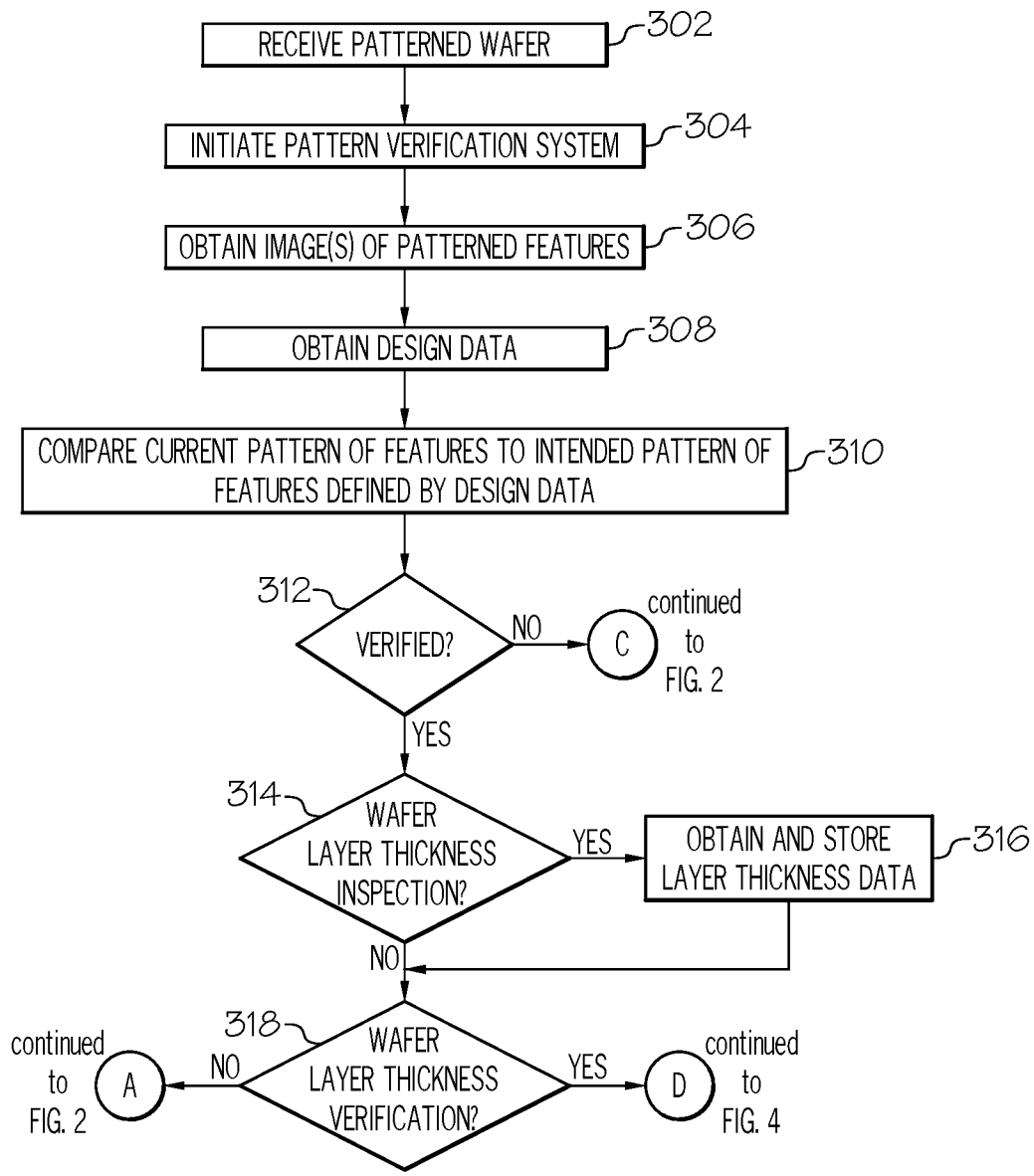
FIG. 3 is an operational flow diagram illustrating a more detailed process of the trusted inspection and verification operation shown in step 210 of FIG. 2 according one embodiment of the present invention.
Figure 4:
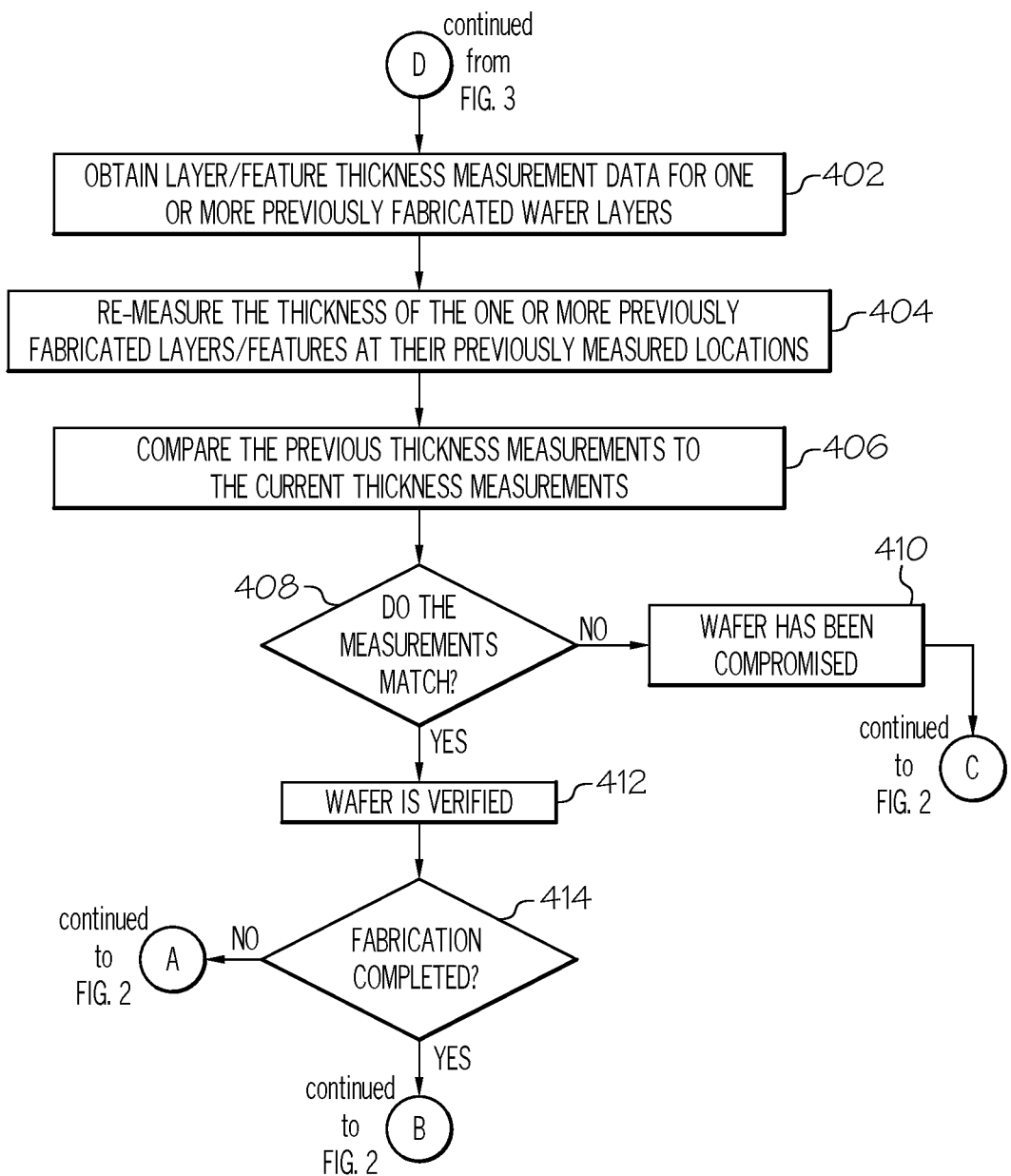
FIG. 4 is an operational flow diagram continuing on from step 318 of FIG. 3 and illustrating a detailed process for trusted wafer layer thickness verification according one embodiment of the present invention.

FIGS. 3-4 are operational flow diagrams illustrating an overall process of the inspection and verification operations performed by the TWIS 104 at step 210 of FIG. 2. As discussed above, after a layer of features has been patterned on the wafer 120 and defect inspection has completed the wafer 120 is transferred to the TWIS 104. The TWIS 104 receives the wafer 120 at step 302. The information processing system 124 initiates the pattern verification system 126 at step 304. In one embodiment, the pattern verification system 126 is initiated based on events such as detecting that the wafer 120 has been transferred to the TWIS 104, a user input received locally at the TWIS 104, a remote user input signal, a signal received from one or more of the stations/components of the semiconductor fabrication plant 102, and/or the like.

Upon initiation, the pattern verification system 126 analyzes the wafer 120 and obtains image data 138 for the wafer 120 at step 306. The image data 138 is stored in local storage and/or in remote storage and may be annotated with a unique identifier that uniquely identifies the associated wafer 120. In one embodiment, the image data 138 comprises one or more images of feature patterns across the entire wafer 120, across one or more dies of the wafer 120, across portions of one or more dies, and/or the like. The image data 138, in one embodiment, is obtained using a scanning electron microscope (SEM), transmission electron microscope (TEM), an optical-based scanner or imaging system, a radiation-based imaging system, a combination of some/all of the above, and/or the like.

The pattern verification system 126 obtains the design data 134 for the current fabrication layer of the wafer 120 at step 308. For example, if the current fabrication layer is Layer_1 the design data 134 for Layer_1 is obtained. The design data 134 may be stored locally on the TWIS 104 or on a trusted remote system. The design data 134 may comprise attributes or metadata that enables the pattern verification system 126 to determine the set of design data 134 associated with the current fabrication layer being inspected. The design data 134, in one embodiment, further comprises data such as pattern locations/coordinates, pattern layouts, pattern shapes, pattern dimensions (e.g., length and width), and/or the like utilized by a photomask fabricator to fabricate the photomask. The design data 134 may also comprise a simulated or rendered pattern layout for the current fabrication layer.

Figure 5:
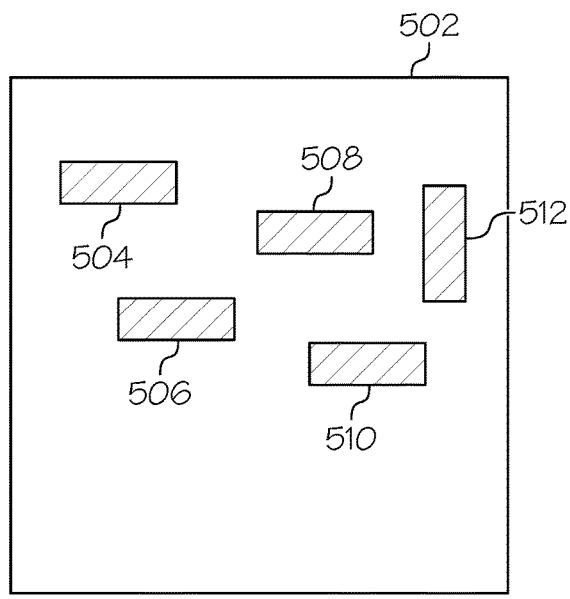
FIG. 5 is an illustrative example of design data according one embodiment of the present invention.

The pattern verification system 126, at step 310, then compares the image data 138 for the current layer of patterned features with the corresponding design data 134 to determine if the current pattern of features on the wafer 120 matches the intended pattern of features as defined by the design data 134. For example, FIG. 5 shows one example of design data 502 comprising a plurality of desired patterns 504 to 512. In this example, the design data 502 comprises a rendered or simulated desired layout of patterns associated with the current fabricated layer of the wafer 120.

Figure 6:
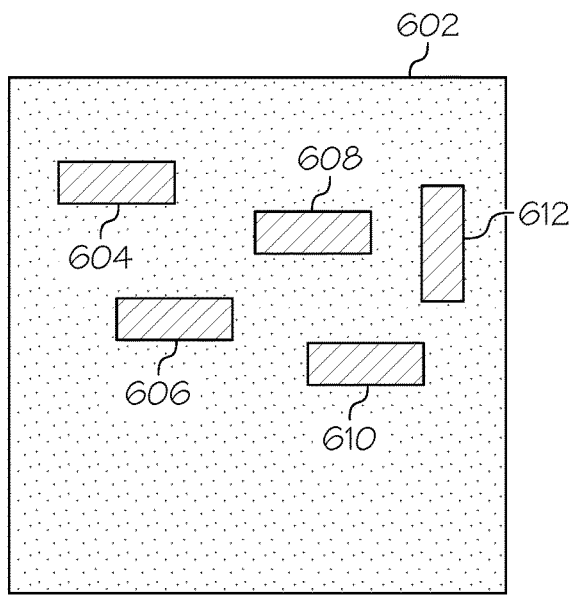
FIG. 6 is an illustrative example of imaging data associated with a layer of features patterned on a semiconductor wafer that is used as part of the trusted inspection and verification operations of FIGS. 2 and 3 according one embodiment of the present invention.

FIG. 6 shows one example of wafer image data 602 obtained for the current layer of patterned features of the wafer 120. The pattern verification system 126, in this example, compares the desired pattern layout shown in FIG. 5 to fabricated pattern layout shown in FIG. 6 and determines that layout, shape, size, etc. of the desired patterns 504 to 512 and actual patterns 604 to 612 match (at least within a given threshold). Therefore, the current layer of patterned features is considered verified/authentic and the wafer 120 is considered secure (e.g., not compromised) since the layer of patterned features matches the desired layer of patterned features.

Figure 7:
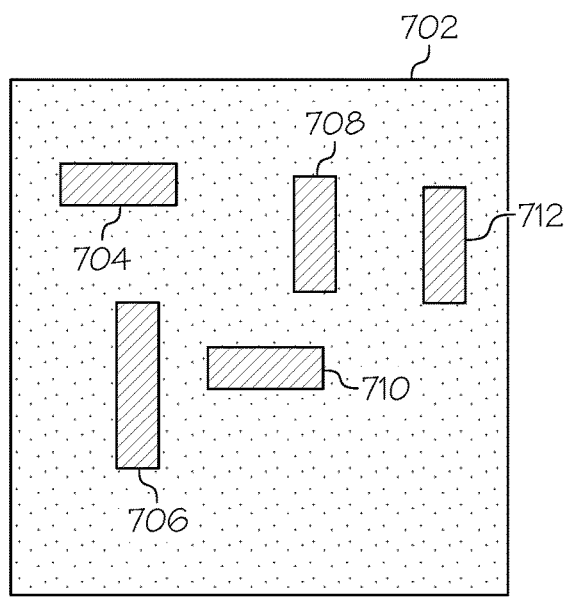
FIG. 7 is another illustrative example of imaging data associated with a layer of features patterned on a semiconductor wafer that is used as part of the trusted inspection and verification operations of FIGS. 2 and 3 according one embodiment of the present invention.

However, consider the wafer image data 702 shown in FIG. 7 representing another example of a fabricated layer of patterned features for the wafer 120. In this example, the pattern verification system 126 determines that the pattern of features for the current layer does not match desired pattern of features as defined by the design data 502 shown in FIG. 5. For example, features 706 to 710 of FIG. 7 do not match the position/location and shape of features 706 to 710 of FIG. 7. Therefore, the layer of patterned features associated with the wafer image data 702 of FIG. 7 is considered "not verified" or "tampered with" and the corresponding wafer is considered compromised.

The pattern verification system 126 may utilize various techniques to compare the wafer image data 138 for the current layer of patterned features with the corresponding design data 134. For example, in one embodiment, image analysis techniques are utilized to compare an image of the current feature patterns to a rendered/simulated image of the intended feature patterns defined by the design data 134. In some embodiments, an actual image of the corresponding photomask may be utilized as well. In another embodiment, data such as pattern locations/coordinates, pattern shapes, pattern dimensions (e.g., length and width), and/or the like are extrapolated from the image 138 of the current pattern of features and compared to similar data in the design data 134.

It should be noted that other methods/techniques for comparing the image 138 of the current pattern of features and corresponding design data 134 are applicable as well. In one embodiment, the pattern verification system 126 stores the results of pattern inspection operation as part of the wafer data 130. For example, data such as a unique identifier associated with the wafer 120, an identifier associated with the current patterned layer being inspected, time and date, an indication whether the inspected layer is verified or not verified (e.g., unauthorized changes/modifications made to the layer), and/or the like.

Figure 8:
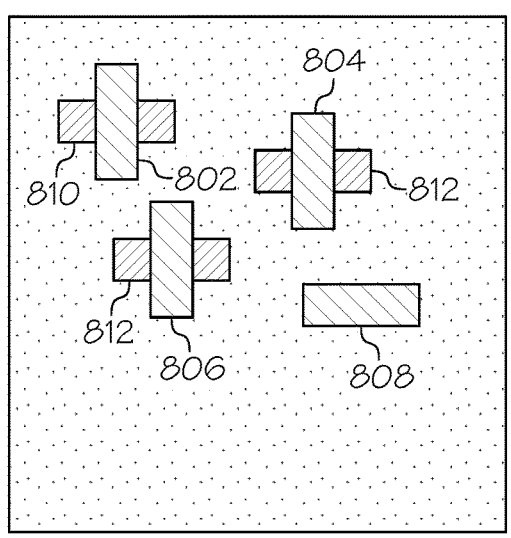
FIG. 8 is a further illustrative example of overlaying imaging data for a current fabricated wafer layer onto a previously fabricated wafer layer as part of the trusted inspection and verification operations of FIGS. 2 and 3 according one embodiment of the present invention.

In addition, the processes discussed above may also be utilized to perform pattern verification for integrated wafers comprising previously fabricated levels. In this embodiment, the pattern verification system 126 overlays the pattern of expected features obtained from the design data 134 onto the previously fabricated levels of patterned features as shown in FIG. 8. For example, FIG. 8 shows an expected pattern of features 802 to 808 overlaid on previously fabricated levels of patterned layers 810 to 812. The expected pattern of features 802 to 808 may be overlaid onto the previously patterned features by a projection mechanism, simulation, and/or the like. The pattern verification system 126 then compares an image of the overlaid/previously patterned features with the image of the actual patterned of features similar to that discussed above with respect to FIGS. 5-7.

Returning now to step 312 FIG. 3, if the pattern verification system 126 determines that the current layer of patterned features has been tampered with the flow proceeds to entry point C of FIG. 2 where one or more security measures are taken at step 216. For example, the information processing system 124 may generate one or more commands that are issued to one or more components of the fabrication facility 102 to shut down production. In another example, the information processing system 124 may automatically (or be manually instructed to) destroy the compromised wafer 120. Alternatively, the information processing system 124 may instruct one or more components of the TWIS 104 to remove the compromised wafer 120 from the fabrication line and place the compromised wafer in a quarantine area where the chips may be further inspected by authorized personnel.

In yet another example, a message(s) may be sent from the information processing system 124 to one or more information processing systems via the network 140 indicating that a given wafer 102 has been compromised. The message may be sent as soon as a determination is made that the wafer 120 has been compromised, after fabrication of the wafer 120 has completed, after fabrication of a given number of wafers 120 has been completed, and/or the like. The message, in one embodiment, comprises data such as the unique identifier associated with the wafer 120, the identifier associated with the current patterned layer that has been compromised, time and date of layer inspection, fabrication facility identifier, and/or the like. The entity receiving the message(s) may then take an appropriate action. After security measures have been taken processing may return to step 202 for the next layer or wafer to be fabricated, or fabrication may be stopped at step 220 depending on the configuration of the TWIS 104.

If the current layer of patterned features has been verified a determination is made, at step 314, whether wafer layer inspection is to be performed. In one embodiment, wafer layer inspection includes measuring the thickness at one or more locations on the layer across one or more areas of the wafer 120. In one embodiment, the information processing system 124 utilizes the wafer layer inspection data 136 to determine whether wafer layer inspection/verification operations are to be performed. The wafer layer inspection data 136 may comprise data such as wafer identifiers, layer identifiers, measurement location data, layer feature identifiers, layer thickness measurement data, and/or the like.

Wafer identifier data comprises a unique identifier associated with a wafer 120. Layer identifier data indicates at which fabrication layer or layers inspection/verification operations are to be performed. Measurement location data comprises coordinates or other location identifying mechanisms indicating areas on a wafer that have been selected for thickness measurements operations. Measurement location data further indicates one or more locations at which thickness measurements are to be taken for the layer located within the selected wafer areas. Layer feature identifier data indicates the type of feature to be measured such as isolation regions, encapsulation layers, dielectric layers, and/or the like. Layer thickness measurement data comprises thickness measurement data obtained for the wafer layers associated with the one or more selected wafer areas. The wafer layer inspection data 136 may be global across all wafers, specific to one or more wafers 120, to one or more dies, fabrication layers, and/or the like. The TWIS 104 may be configured with the same wafer layer inspection data 136 for all wafers or different wafer layer inspection data 136 may be utilized for one or more different wafers, dies, fabrication layers, etc.

In some embodiments, the TWIS 104 is configured to perform thickness measurements for every fabrication layer. In these embodiments, the information processing system 124 does not need to make the determination at step 314 whether wafer layer thickness inspection is to be performed nor does the wafer layer inspection data 136 need to be analyzed for making this determination. However, the wafer layer inspection data 136 still may be utilized to determine the inspection parameters/attributes for the current wafer layer. For example, the wafer layer inspection data 136 may still be utilized to determine which areas of the wafer are to be inspected and which locations/features of the layer within the identified wafer areas are to be measured. In other embodiments, the TWIS 104 is configured to perform thickness measurements for one or more previously selected fabrication layers (i.e., not randomly or dynamically selected).

In another embodiment, the information processing system 124 randomly determines when and where wafer layer thickness inspection is to be performed. In these embodiments, the information processing system 124 is configured to randomly select at least one layer of patterned features for an associated thickness inspection process. The information processing system 124 may also randomly select wafers areas and locations/features of a selected layer within the wafer areas for inspection. Information identifying the randomly selected layers, wafer areas, and layer locations/features may be stored within the wafer layer inspection data 136. Accordingly, the information processing system 124 may utilize various mechanisms such as wafer data 130 analysis, random selection, hard coding, and/or the like to determine when to perform wafer layer thickness inspection.

Figure 9:
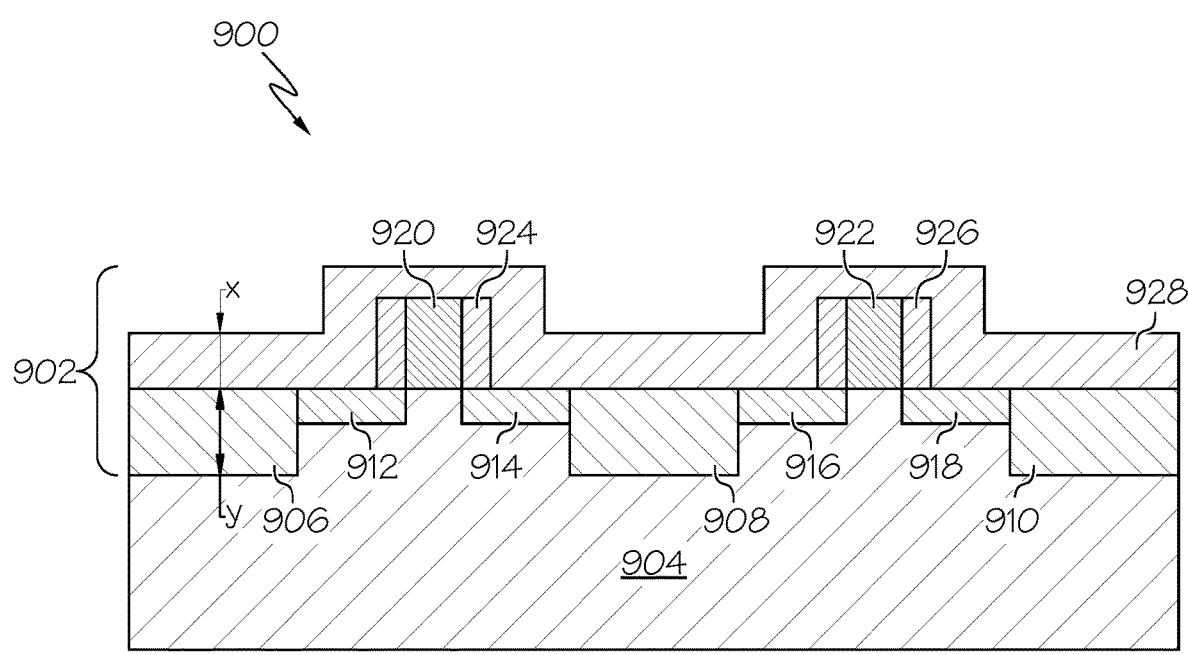
FIG. 9 is cross-sectional view of a semiconductor device comprising a first layer and illustrates one example of performing wafer thickness measurement thereon according one embodiment of the present invention.
Figure 10:
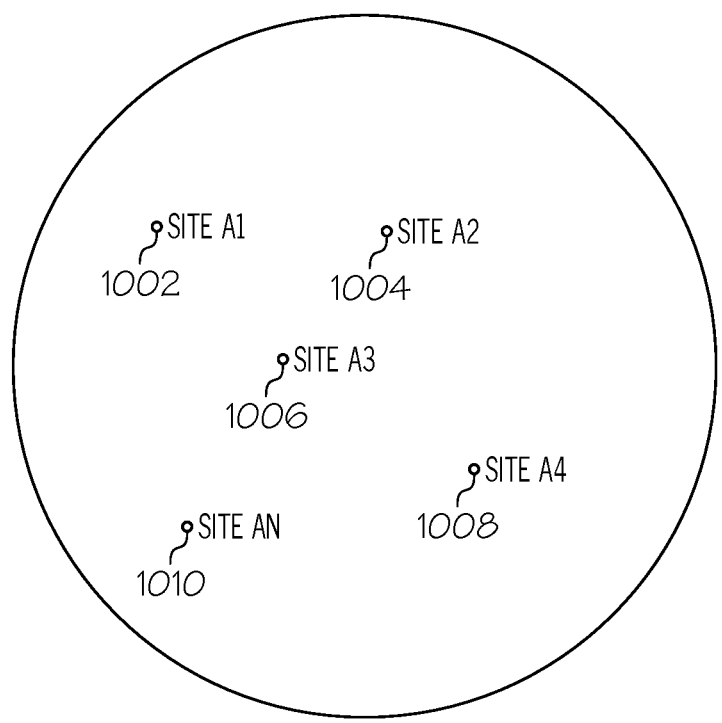
FIG. 10 is a top-down view of the semiconductor wafer on which the semiconductor device of FIG. 9 was fabricated and illustrates a first set of inspection sites areas across the semiconductor wafer at which the wafer thickness measurements were taken according one embodiment of the present invention.

If the information processing system 124 determines that wafer layer thickness inspection is not to be performed for the current wafer layer processing continues to step 318, which is discussed in greater detail below. However, when the information processing system 124 determines that wafer layer thickness inspection is to be performed for the current wafer layer the information processing system 124 initiates the wafer layer measurement system 128 to obtain layer measurements at step 316. In one embodiment, the wafer layer measurement system 128 measures the thickness of the wafer layer at one or more locations on the layer and across one or more areas of the wafer 120. For example, FIG. 9 shows a cross-sectional view of a semiconductor device 900 formed on a wafer 120 at a first wafer site 1002 (FIG. 10). In this example, the wafer layer 902 has been fabricated on a substrate 904 and comprises shallow trench isolation regions 906 to 910; source/drains 912 to 918; gate stacks 920, 922; gate spacers 924, 926; and an encapsulation layer 928.

In this example, after analyzing the wafer layer inspection data 136 the wafer layer measurement system 128 determines that the thickness of a shallow trench isolation region 906 and the thickness of a portion of the encapsulation layer 928 are to be measured. In at least some embodiments, portions/features of a layer that will not covered by subsequent processing steps are selected to be inspected so that they may be re-measured at a later point in time. The measurement system 128 obtains a first thickness measurement A 930 for the shallow trench isolation region 906 and a second thickness measurement B 932 for the portion of the encapsulation layer 928. In one embodiment, the measurement system 128 comprises one or more systems/tools capable of measuring layer/feature thickness such as (but not limited to) an ellipsometer, an interferometer, a microspectrophotometer, and/or the like.

The wafer layer measurement system 128, in one embodiment, stores its measurements as part of the wafer layer inspection data 136 although the measurements may be stored separate from the wafer layer inspection data 136 as well. Other data may be stored along with the thickness measurement data such as a layer identifier, the location on the layer at which the measurements were taken, feature types that were measured, area of the wafer in which the measurement was taken, and/or the like. In some embodiments, the wafer layer measurement system 128 only performs a wafer layer thickness inspection at a single wafer site 1002. However, in other embodiments, the wafer layer measurement system 128 performs wafer layer thickness inspection across multiple sites 1002 to 1010 as shown in FIG. 10.

Figure 11:
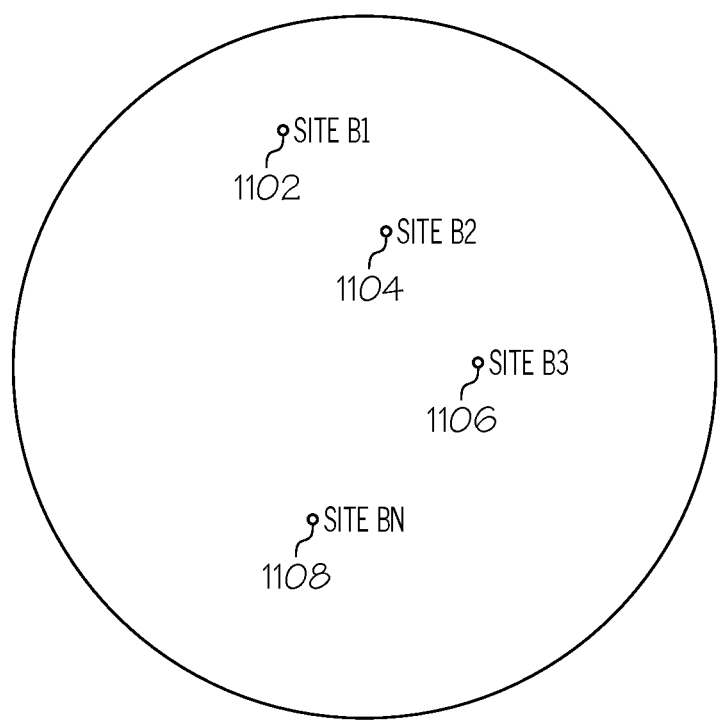
FIG. 11 is another top-down view of the semiconductor wafer and illustrates a second set of inspection areas across the semiconductor wafer at which wafer thickness measurements were taken for the subsequently fabricated layers shown in FIG. 12 according one embodiment of the present invention.
Figure 12:
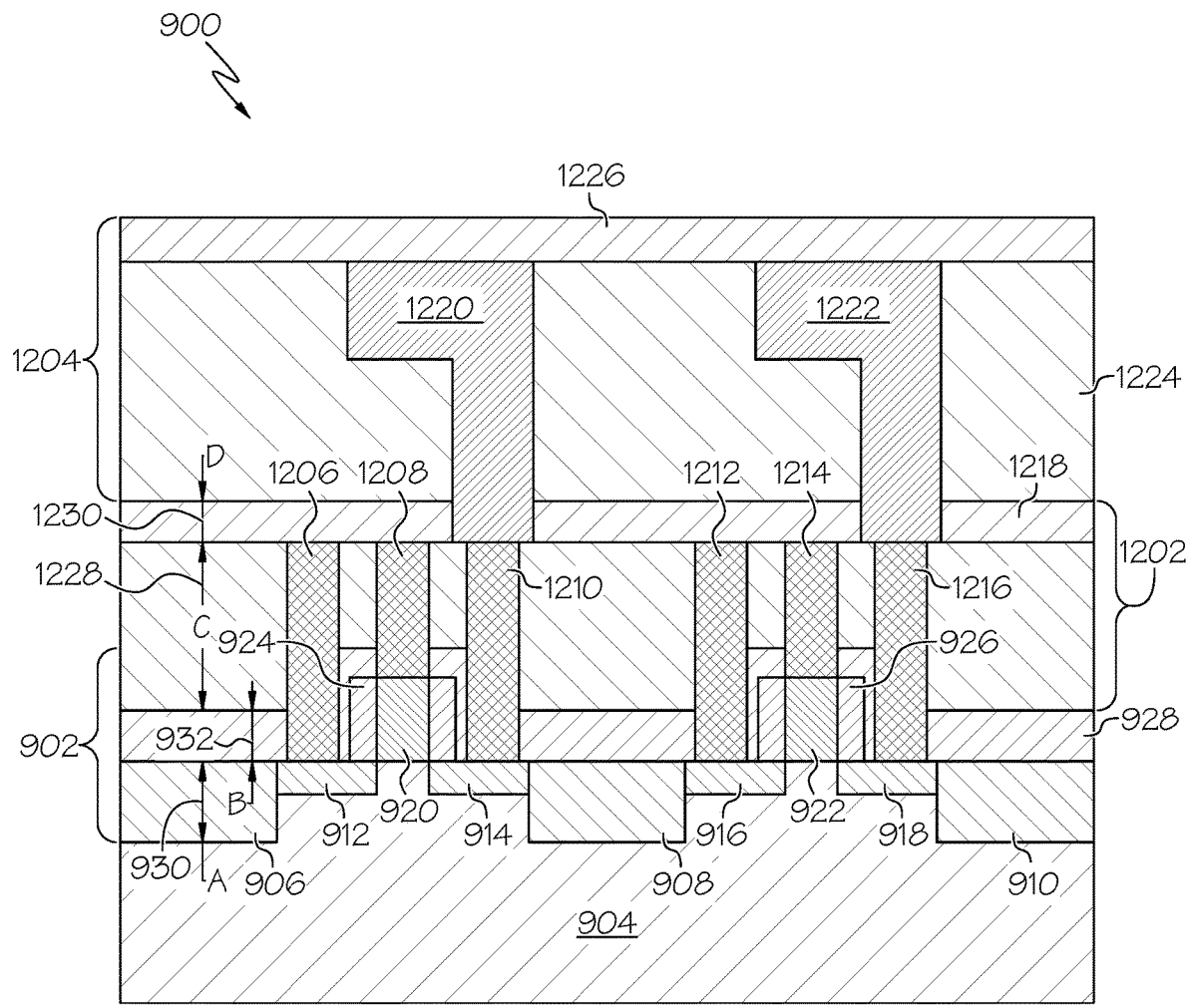
FIG. 12 is cross-sectional view of the semiconductor device of FIG. 9 after additional layers have been fabricated and illustrates another example of performing wafer thickness measurement thereon according one embodiment of the present invention.

For example, FIG. 10 shows a top-down view of a wafer 1002 where multiple inspection sites 1002 to 1010 are indicated across the wafer 1002. Each site 1002 to 1004 is in a different area of the wafer 1002 such as different dies. The thickness of the same portions/features of corresponding layers may be measured in each of the different inspection sites 1002 to 1010. However, the thickness of different portions/features of corresponding layers may be measured for two or more of the inspection sites 1002 to 1010. The location and/or number of the inspection sites across the wafer 120 may be the same or different for two or more wafer layers. For example, FIG. 11 shows the inspection sites 1102 to 1108 for a second wafer layer 1202 (FIG. 12) as having a different number of sites and different locations than the inspection sites 1002 to 1010 for the first wafer layer 902.

Returning now to FIG. 3, after the wafer layer thickness inspection has been performed for one or more selected inspection sites 1002 to 1010 processing flows to step 318 where the information processing system 124 determines whether wafer layer thickness verification is to be performed for one or more previously fabricated layers. It should be noted that this determination may also be performed prior to or concurrently with the determination made in step 314. In one embodiment, the information processing system 124 makes the determination at step 318 by analyzing the wafer data 130.

For example, the information processing system 124 determines if any layer thickness measurement data has been stored for previously fabricated layers. If layer thickness measurement data has not been stored for previously fabricated layers, the information processing system 124 determines that wafer layer thickness verification does not need to be performed for one or more of previously fabricated layers and processing returns to step 202 for processing of subsequent wafer layers. For example, when considering a wafer 120 at the fabrication point shown in FIG. 9 the information processing system 124 would determine that wafer layer thickness verification does not need to be performed since measurements have not been taken for previous fabrication layers.

If layer thickness measurement data has been stored for one or more previously fabricated layers or if the information processing system 124 determines that fabrication of the wafer 120 has completed, processing flows to FIG. 4 wherein one or more wafer layer thickness verification operations are performed. For example, consider the example shown in FIG. 12 where subsequent layers 1202, 1204 of patterned features have been formed on layer 902 of the semiconductor device 900 in FIG. 9. In this example, a second layer 1202 comprises one or more contacts 1206 to 1216, a dielectric layer 1218, and an encapsulation layer 1120. A third layer 1204 comprises metallization layers 1220, 1222; a dielectric layer 1224; and an encapsulation layer 1226.

The information processing system 124 determines from, for example, the wafer data 130 that wafer layer thickness verification is to be performed for the first wafer layer 902 and the second wafer layer 1202. The information processing system 124, at step 402, obtains layer/feature thickness measurement data for these wafer layers 902, 1202 from the wafer data 130. The system 124, at step 404, instructs the wafer layer measurement system 128 to re-measure the portions/features of the wafer layers 902, 1202 at their previously measured layer locations and inspection sites to obtain measurement A 930 and B 932 for the first layer 902 and measurements C 1228 and D 1230 for the second layer 1202. As discussed above, information processing system 124 may determine the previously measured wafer layer portions/features, their locations, and inspection sites from wafer data 130 such as the wafer layer inspection data 136. It should be noted that, in another embodiment, if one or more previously fabricated layers and current layers are accessible at the same time the information processing system 124 measures the thickness of these layers together to obtain a single thickness measurement for the multiple layers.

The information processing system 124 compares the previous thickness measurement data for these wafer layers 902, 1202 to the new measurement data at step 406. The information processing system 124, at step 408, then determines if the previous thickness measurement data matches new measurement data based on the comparison performed at step 406. If the measurements do not match the information processing system 124, at step 410, determines that the wafer 120 has been compromised and the current wafer is an unauthorized/imposter wafer. In other words, the information processing system 124 determines that the wafer has been tampered with or the expected wafer has been replaced with a malicious wafer. Upon this determination, processing flows to entry point C of FIG. 2 where one or more security measures are taken as discussed above.

However, if the new thickness measurements match the previous thickness measurements for the wafer layer portions/features the information processing system 124, at step 412, considers the wafer 120 as verified/authentic. In other words, the current wafer is the expected wafer and has not been compromised or replaced. The information processing system 124 then determines if fabrication of the wafer 120 has completed. If fabrication has not completed the process flow returns to entry point A of FIG. 2 where processing is initiated for the next fabrication layer of the wafer 120. However, if fabrication of the wafer 120 has completed the process flows to entry point B of FIG. 2 where dicing and packaging operations are performed. It should be noted that, in some embodiments, the wafer layer thickness verifications operations may also be performed at a customer's trusted location upon receiving the packaged devices.

Figure 13:
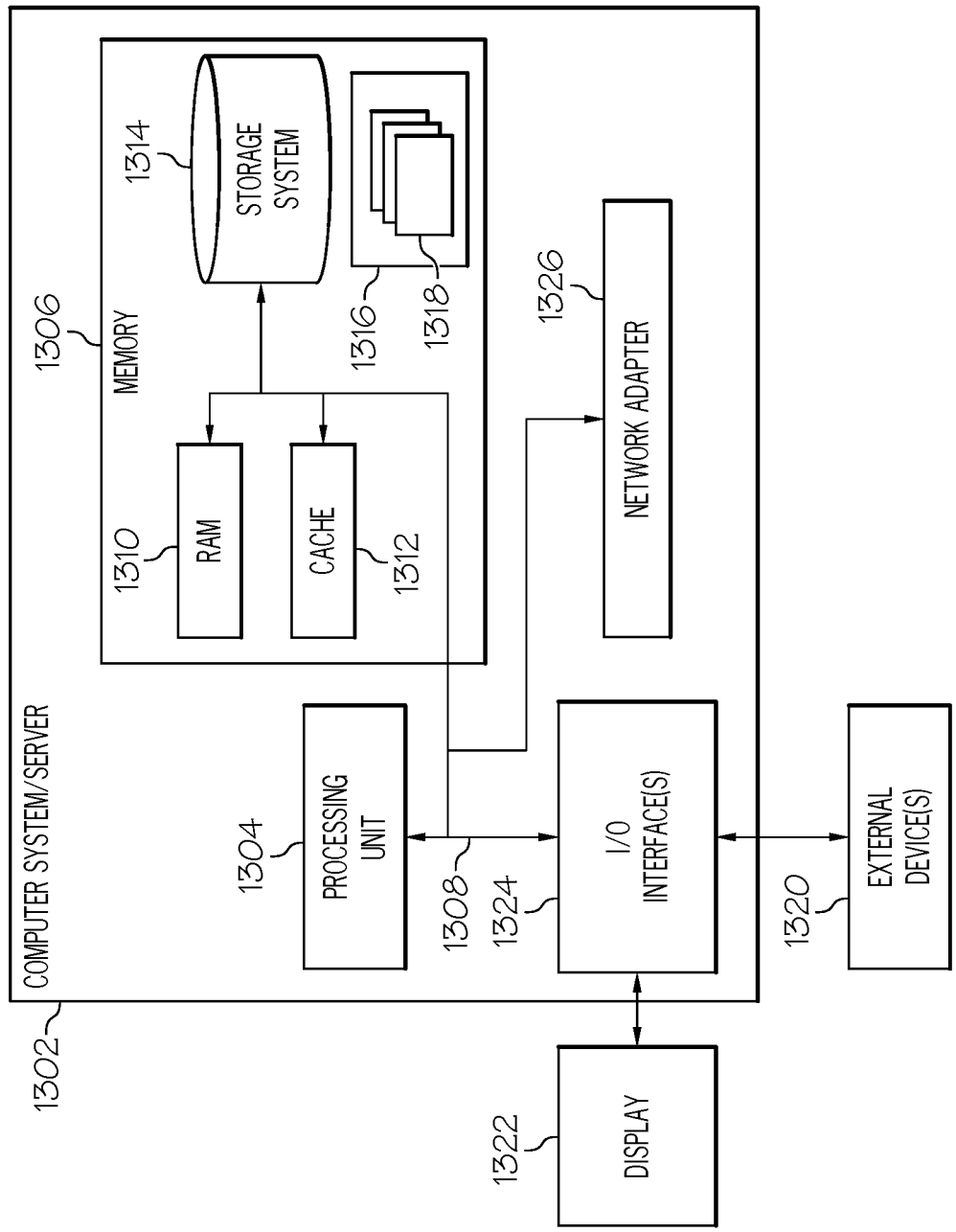
FIG. 13 is a block diagram illustrating one example of an information processing system according to one embodiment of the present invention.

FIG. 13 shows one example of a block diagram illustrating an information processing system 1302 that may be utilized in embodiments of the present invention. The information processing system 1302 may be based upon a suitably configured processing system configured to implement one or more embodiments of the present invention such as the information processing systems 104 and/or 106 of FIG. 1.

Any suitably configured processing system may be used as the information processing system 1302 in embodiments of the present invention. The components of the information processing system 1302 may include, but are not limited to, one or more processors or processing units 1304, a system memory 1306, and a bus 1308 that couples various system components including the system memory 1306 to the processor 1304. The bus 1308 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Although not shown in FIG. 13, the main memory 1306 may include the various types of data 134, 136, and 138 discussed above with respect to FIG. 1. The system memory 1306 may also include computer system readable media in the form of volatile memory, such as random access memory (RAM) 1310 and/or cache memory 1312. The information processing system 1302 may further include other removable/non-removable, volatile/non-volatile computer system storage media. By way of example only, a storage system 1314 may be provided for reading from and writing to a non-removable or removable, non-volatile media such as one or more solid state disks and/or magnetic media (typically called a "hard drive"). A magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each may be connected to the bus 1308 by one or more data media interfaces. The memory 1306 may include at least one program product having a set of program modules that are configured to carry out the functions of an embodiment of the present invention.

Program/utility 1316, having a set of program modules 1318, may be stored in memory 1306 by way of example, and not limitation, as well as an operating system, one or more application programs, other program modules, and program data. Each of the operating system, one or more application programs, other program modules, and program data or some combination thereof, may include an implementation of a networking environment. Program modules 1318 generally carry out the functions and/or methodologies of embodiments of the present invention.

The information processing system 1302 may also communicate with one or more external devices 1320 such as a keyboard, a pointing device, a display 1322, etc.; one or more devices that enable a user to interact with the information processing system 1302; and/or any devices (e.g., network card, modem, etc.) that enable computer system/server 1302 to communicate with one or more other computing devices. Such communication may occur via I/O interfaces 1324. Still yet, the information processing system 1302 can communicate with one or more networks such as a local area network (LAN), a general wide area network (WAN), and/or a public network (e.g., the Internet) via network adapter 1326. As depicted, the network adapter 1326 communicates with the other components of information processing system 1302 via the bus 1308. Other hardware and/or software components can also be used in conjunction with the information processing system 1302. Examples include, but are not limited to: microcode, device drivers, redundant processing units, external disk drive arrays, RAID systems, tape drives, and data archival storage systems.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. The terminology used herein is for the purpose of describing particular embodiments only and is not intended to be limiting of the invention.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

As will be appreciated by one skilled in the art, aspects of the present invention may be embodied as a system, method, or computer program product. Accordingly, various aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Python, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been discussed above with reference to flowchart illustrations and/or block diagrams of methods, apparatus (systems) and computer program products according to various embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Although specific embodiments have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also note that these embodiments are only examples of the many advantageous uses of the innovative teachings herein. In general, statements made in the specification of the present application do not necessarily limit any of the

What is claimed is:

1. A method for verifying semiconductor wafers, the method comprising:
   receiving a semiconductor wafer comprising a plurality of layers;
   obtaining a first set of measurement data for a layer of the plurality of layer, the first set of measurement data comprising at least one thickness measurement for one or more portions of the layer that was recorded prior to at least one additional layer of the plurality of layers having been fabricated;
   comparing the first set of measurement data to a second set of measurement data for the layer, the second set of measurement data comprising at least one new thickness measurement for the one or more portions of the layer obtained after fabrication of the at least one additional layer; and
   determining the semiconductor wafer is an authentic wafer based on the second set of measurement data corresponding to the first set of measurement data.

2. The method of claim 1, further comprising:
   determining the semiconductor wafer is not an authentic wafer based on the second set of measurement data failing to correspond to the first set of measurement data.

3. The method of claim 1, wherein determining the semiconductor wafer is an authentic further comprises:
   obtaining design data defining an expected pattern of features for the layer;
   obtaining imaging data for the layer capturing features patterned on the semiconductor wafer;
   determining if the imaging data corresponds to the design data; and
   determining the semiconductor wafer is an authentic wafer further based on the imaging data corresponding to the design data.

4. The method of claim 1, further comprising:
   obtaining the second set of measurement data for the layer by measuring a thickness of the layer at a first set of locations on the layer corresponding to a second set of locations on the layer at which the first set of measurement data was taken.

5. The method of claim 4, wherein obtaining the second set of measurement data further comprises:
   obtaining the second set of measurement data for the layer by measuring the thickness of the layer at the first set of locations across a plurality of different areas on the semiconductor wafer.

6. The method of claim 1, further comprising:
   obtaining a thickness measurement for a most recently fabricated layer of the plurality of layers at one or more locations of the most recently fabricated layer; and
   storing the measured thickness.

7. The method of claim 6, further comprising:
   obtaining the thickness measurement for the most recently fabricated layer at the one or more locations across a plurality of different areas of the semiconductor wafer.

8. The method of claim 6, wherein the layer of the plurality of layers was fabricated prior to the most recently fabricated layer of the plurality of layers.

9. The method of claim 1, wherein the first set of measurement data further comprises location data identifying one or more locations on the layer at which at least one previously recorded thickness measurement was taken.

10. The method of claim 9, wherein the at least one previously recorded thickness measurement comprises a plurality of previously recorded thickness measurements each taken at the one or more locations on the layer within a different area of the semiconductor wafer.

11. The method of claim 1, further comprising:
    obtaining a third set of measurement data for the at least one additional layer of the plurality of layers, the third set of measurement data comprising at least one previously recorded thickness measurement for one or more portions of the at least one additional layer;
    comparing the third set of measurement data to a fourth set of measurement data for the at least one additional layer, the fourth set of measurement data comprising at least one new thickness measurement for the one or more portions of the at least one additional layer; and
    determining the semiconductor wafer is an authentic wafer based on the second set of measurement data corresponding to the first set of measurement data and the fourth second of measurement data corresponding to the third set of measurement data.

12. A system for verifying semiconductor wafers, the system comprising:
    memory; and
    one or more processors, wherein the one or more processors operate during fabrication of features on a semiconductor wafer to:
      receive, after fabrication of a first individual layer, a semiconductor wafer after an individual layer comprising one or more features has been fabricated thereon;
      obtain a first set of measurement data for a first feature of the first individual layer and a second set of measurement data for a second feature of a second individual layer fabricated on the semiconductor wafer prior to the first individual layer, the first and second sets of measurement data comprising at least one previously recorded thickness measurement for one or more portions of the first feature and the second feature, respectively;
      compare the first set of measurement data to a third set of measurement data for the first feature, the third set of measurement data comprising at least one new thickness measurement for the one or more portions of the first feature;
      compare the second set of measurement data to a fourth set of measurement data for the second feature, the fourth set of measurement data comprising at least one new thickness measurement for the one or more portions of the second feature;
      determine the semiconductor wafer is an authentic wafer based on the third set of measurement data corresponding to the first set of measurement data and the fourth set of measurement data corresponding to the second set of measurement data; and
      determine the semiconductor wafer is not an authentic wafer based on one or more of
        the third set of measurement data failing to correspond to the first set of measurement data, or
        the fourth set of measurement data failing to correspond to the second set of measurement data.

13. The system of claim 12, wherein the one or more processors further operate to:
    obtain at least the third set of measurement data for the first feature by measuring a thickness of the first feature at a first set of locations on the first individual layer corresponding to a second set of locations on the first individual layer at which the first set of measurement data was taken.

14. The system of claim 12, wherein the one or more processors operate to obtain the second set of measurement data by:
obtaining at least the third set of measurement data for the first feature by measuring a thickness of multiple instances of the first feature on the first individual layer across a plurality of different areas on the semiconductor wafer.

15. A computer program product for verifying semiconductor wafers, the computer program product comprising a computer readable storage medium having program instructions embodied therewith, the program instructions executable by an information processing system to cause the information processing system to perform a method comprising:
receiving a semiconductor wafer comprising a plurality of layers;
obtaining a first set of measurement data for at least one layer of the plurality of layers, the first set of measurement data comprising at least one previously recorded thickness measurement for one or more portions of the at least one layer;
obtaining a second set of measurement data for the at least one layer by measuring a thickness of at least one portion of the at least one layer that is to remain exposed during subsequent processing operations;
comparing the first set of measurement data to the second set of measurement data;
determining the semiconductor wafer is an authentic wafer based on the second set of measurement data corresponding to the first set of measurement data; and
determining the semiconductor wafer is not an authentic wafer based on the second set of measurement data failing to correspond to the first set of measurement data.

16. The computer program product of claim 15, wherein obtaining the second set of measurement data further comprises:
measuring a thickness of the at least one layer at a first set of locations on the at least one layer corresponding to a second set of locations on the at least one layer at which the first set of measurement data was taken.

17. The computer program product of claim 16, wherein obtaining the second set of measurement data further comprises:
obtaining the second set of measurement data for the at least one layer by measuring the thickness of the at least one layer at the first set of locations across a plurality of different areas on the semiconductor wafer.

18. The computer program product of claim 15, wherein the method further comprises:
obtaining a thickness measurement for a most recently fabricated layer of the plurality of layers at one or more locations of the most recently fabricated layer; and
storing the measured thickness.

19. The computer program product of claim 18, wherein the method further comprises:
obtaining the thickness measurement for the most recently fabricated layer at the one or more locations across a plurality of different areas of the semiconductor wafer.

20. The computer program product of claim 15, wherein the first set of measurement data further comprises location data identifying one or more locations on the at least one layer at which at least one previously recorded thickness measurement was taken, and
wherein the at least one previously recorded thickness measurement comprises a plurality of previously recorded thickness measurements each taken at the one or more locations on the at least one layer within a different area of the semiconductor wafer.

* * * * *